US009804496B2

(12) United States Patent
Yamaguchi

(10) Patent No.: US 9,804,496 B2
(45) Date of Patent: Oct. 31, 2017

(54) METHOD OF FORMING A WIRING PART OF A FLEXURE

(71) Applicant: NHK Spring Co., Ltd., Yokohama-shi, Kanagawa (JP)

(72) Inventor: Naoki Yamaguchi, Kanagawa (JP)

(73) Assignee: NHK Spring Co., Ltd., Kanagawa (JP)

( * ) Notice: Subject to any disclaimer, the term of this patent is extended or adjusted under 35 U.S.C. 154(b) by 239 days.

(21) Appl. No.: 14/694,371

(22) Filed: Apr. 23, 2015

(65) Prior Publication Data

US 2015/0241788 A1 Aug. 27, 2015

Related U.S. Application Data

(62) Division of application No. 13/166,640, filed on Jun. 22, 2011, now Pat. No. 9,047,895.

(30) Foreign Application Priority Data

Jun. 24, 2010 (JP) .................................. 2010-144287

(51) Int. Cl.
| | |
|---|---|
| *G11B 5/127* | (2006.01) |
| *H04R 31/00* | (2006.01) |
| *G03F 7/36* | (2006.01) |
| *G11B 5/48* | (2006.01) |
| *G03F 7/20* | (2006.01) |
| *H05K 1/05* | (2006.01) |

(52) U.S. Cl.
CPC .................. *G03F 7/36* (2013.01); *G03F 7/20* (2013.01); *G11B 5/486* (2013.01); *G11B 5/4826* (2013.01); *G11B 5/4833* (2013.01); *G11B 5/4853* (2013.01); *H05K 1/056* (2013.01); *H05K 2201/0154* (2013.01); *Y10T 29/49155* (2015.01)

(58) Field of Classification Search
CPC ..... G11B 5/486; G11B 5/4853; G11B 5/4826; G11B 5/4833; G11B 5/484; H05K 1/056; H05K 1/028; H05K 1/118
See application file for complete search history.

(56) References Cited

U.S. PATENT DOCUMENTS

| | | | |
|---|---|---|---|
| 6,414,820 B1 | 7/2002 | Coon et al. | |
| 6,424,500 B1 | 7/2002 | Coon et al. | |
| 6,667,857 B2 | 12/2003 | Kamigama et al. | |
| 6,714,384 B2 | 3/2004 | Himes et al. | |
| 6,757,137 B1 | 6/2004 | Mei | |
| 6,807,029 B2 | 10/2004 | Someya | |

(Continued)

FOREIGN PATENT DOCUMENTS

| | | |
|---|---|---|
| JP | 06-203508 | 7/1994 |
| JP | 09-017139 | 1/1997 |

(Continued)

*Primary Examiner* — Paul D Kim
(74) *Attorney, Agent, or Firm* — Norris McLaughlin & Marcus, P.A.

(57) ABSTRACT

A flexure includes a metal substrate whose front end supports a slider and a wiring part having a base insulating layer and a conductor layer formed on the base insulating layer. The wiring part includes a normal wiring part that is on the metal substrate and an aerial wiring part that is on a space separated from the metal substrate. The base insulating layer of the aerial wiring part is formed to be thinner than that of the normal wiring part. This configuration reduces a rigidity contribution ratio of the wiring part.

3 Claims, 14 Drawing Sheets

(56) References Cited

U.S. PATENT DOCUMENTS

| | | |
|---|---|---|
| 6,900,967 B1 | 5/2005 | Coon et al. |
| 6,963,471 B2 | 11/2005 | Arai et al. |
| 7,009,814 B2 | 3/2006 | Takikawa et al. |
| 7,142,395 B2 * | 11/2006 | Swanson ............... G11B 5/484 360/244.3 |
| 7,511,923 B2 | 3/2009 | Ohwe |
| 7,567,410 B1 | 7/2009 | Zhang et al. |
| 7,652,890 B2 | 1/2010 | Ohsawa et al. |
| 7,684,154 B2 | 3/2010 | Zeng |
| 7,764,467 B2 | 7/2010 | Hanya et al. |
| 7,852,604 B2 | 12/2010 | Sassine |
| 8,082,656 B1 * | 12/2011 | Pokornowski ....... G11B 5/4833 205/119 |
| 8,085,506 B1 | 12/2011 | Ee et al. |
| 8,243,393 B2 | 8/2012 | Yamada |
| 8,792,214 B1 | 7/2014 | Bjorstrom et al. |
| 2004/0027725 A1 | 2/2004 | Pan et al. |
| 2004/0247921 A1 | 12/2004 | Dodsworth et al. |
| 2005/0030670 A1 | 2/2005 | Ando et al. |
| 2005/0047023 A1 | 3/2005 | Childers et al. |
| 2005/0135016 A1 | 6/2005 | Ohwe |
| 2008/0030900 A1 | 2/2008 | Zeng et al. |
| 2008/0180850 A1 | 7/2008 | Rice et al. |

FOREIGN PATENT DOCUMENTS

| | | |
|---|---|---|
| JP | 11-039626 | 2/1999 |
| JP | 2002-092834 | 3/2002 |
| JP | 2007-523500 | 8/2007 |

\* cited by examiner

|  |  | Insulating layer of constant thickness | Insulating layer thinned on conductor layer side |
|---|---|---|---|
| Roll rigidity | [uNm/deg] | 0.534 | 0.483 |
| Roll contribution ratio | % | 21.3 | 12.5 |
| Pitch rigidity | [uNm/deg] | 0.503 | 0.388 |
| Pitch contribution ratio | % | 44.5 | 27.6 |

Fig.16

|  |  | Insulating layer of constant thickness | Insulating layer thinned on metal substrate side |
|---|---|---|---|
| Roll rigidity | [uNm/deg] | 0.534 | 0.502 |
| Roll contribution ratio | % | 21.3 | 15.7 |
| Pitch rigidity | [uNm/deg] | 0.503 | 0.432 |
| Pitch contribution ratio | % | 44.5 | 35.0 |

METHOD OF FORMING A WIRING PART OF A FLEXURE

REFERENCE TO RELATED APPLICATION

This is a divisional application of Ser. No. 13/166,640, filed Jun. 22, 2011, now U.S. Pat. No. 9,047,895, which is currently allowed. The subject matter of the aforementioned prior application is hereby incorporated herein by reference.

BACKGROUND OF THE INVENTION

1. Field of the Invention

The present invention relates to a flexure and a method of forming a wiring part of the flexure, the flexure being a component of a head suspension that is installed in, for example, a hard disk drive of an information processing device.

2. Description of Related Art

The hard disk drive incorporates hard disks that are turned at high speed. The head suspension in the hard disk drive has a slider that is slightly lifted from the hard disk, to write/read data to and from the hard disk. The slider is supported with a flexure attached to the head suspension. The flexure includes a metal substrate and wiring part formed on the metal substrate. A front end of the metal substrate is provided with a tongue to which the slider is attached.

Recent hard disks have high recording density, and therefore, the slider of the head suspension is required to make a flying height, i.e., a distance from the surface of the hard disk as small as possible. To stabilize the minimized flying height, controlling rigidity of the metal substrate and wiring part around the tongue of the flexure is important.

To control the rigidity around the tongue of the flexure, Japanese Unexamined Patent Application Publication No. H06-203508 proposes to thin the metal substrate of the flexure.

When the metal substrate is thinned, a rigidity contribution ratio of the wiring part formed on the metal substrate relatively increases to make it difficult to control the rigidity around the tongue of the flexure.

Alternatively, Japanese Unexamined Patent Application Publication No. H09-17139 proposes to specially shape a face of the metal substrate of the flexure and Japanese Unexamined Patent Application Publication No. H11-39626 proposes to provide the wiring part of the flexure around the tongue with an aerial wiring part separated from the metal substrate.

These related arts, however, are unable to reduce the rigidity contribution ratio of the wiring part.

SUMMARY OF THE INVENTION

An object of the present invention is to provide a flexure having a wiring part whose rigidity contribution ratio is low.

In order to accomplish the object, an aspect of the present invention provides a flexure including a metal substrate whose front end supports a slider and a wiring part having a base insulating layer and a conductor layer formed on the base insulating layer. The wiring part includes a normal wiring, part that is on the metal substrate and an aerial wiring part that is on a space separated from the metal substrate. The base insulating layer of the aerial wiring part is formed to be thinner than that of the normal wiring part.

According to this aspect of the present invention, the base insulating layer of the aerial wiring part is thinned to reduce the rigidity and rigidity contribution ratio of the wiring part. This configuration allows the rigidity of the flexure around the slider to be easily and surely controlled.

Since the base insulating layer is thinned only at the aerial wiring part, a dielectric strength voltage required for the normal wiring part is secured.

BRIEF DESCRIPTION OF THE DRAWINGS

FIG. 16 is a table listing rigidity contribution ratios of the second embodiment and comparative example;

DETAILED DESCRIPTION OF EMBODIMENTS

Flexures according to embodiments of the present invention will be explained in detail with reference to the drawings. Each embodiment reduces the rigidity contribution ratio of a wiring part of a flexure by thinning a base insulating layer of an aerial wiring part of the wiring part.

Figure 2:
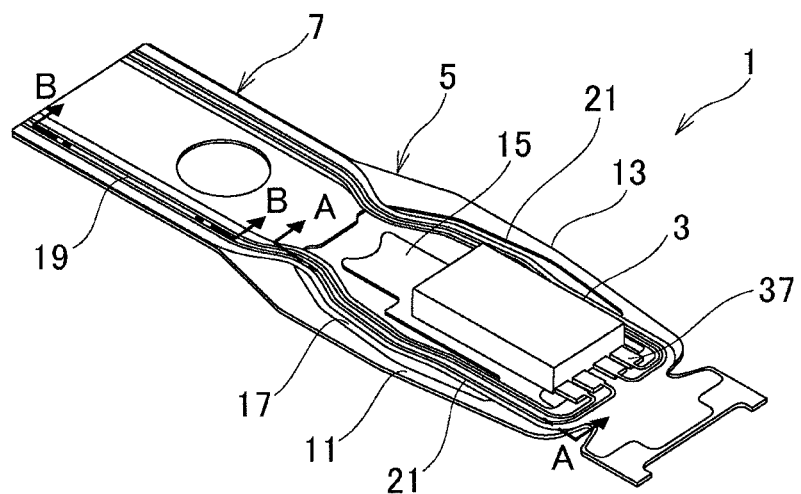
FIG. 2 is an enlarged perspective view illustrating a top surface of a part of the flexure of FIG. 1.
Figure 8:
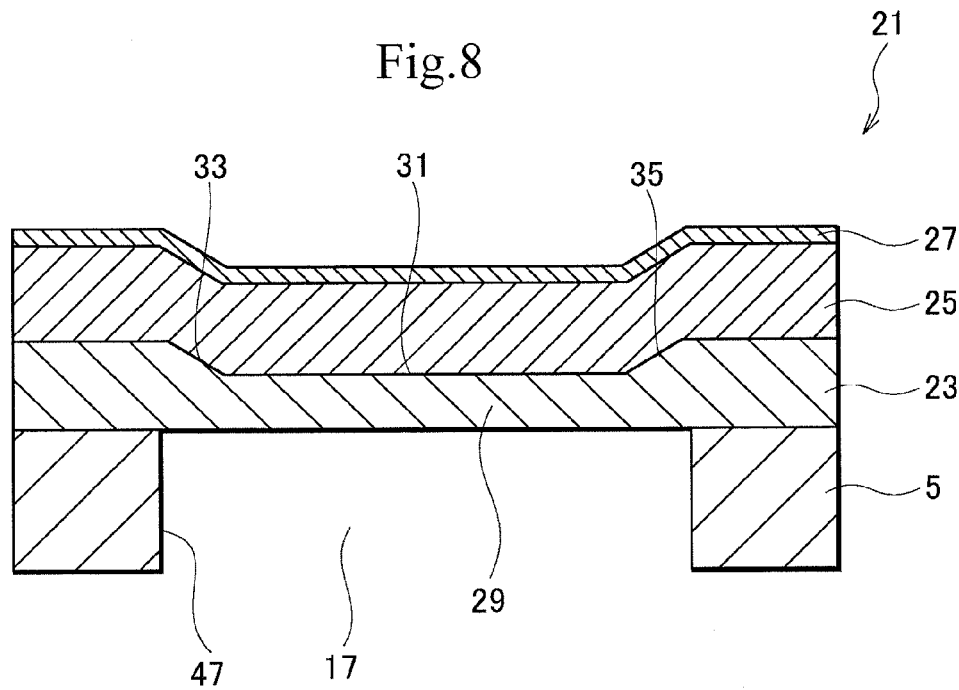
FIG. 8 is a sectional view taken along a line A-A of FIG. 2, illustrating an aerial wiring part.

The accompanying drawings illustrate typical models of the embodiments in such a way as to clearly and understandably explain characteristics of the present invention. Dimensions of parts illustrated in the drawings, or dimensional relationships and proportions among the parts, therefore, are irrelevant to those of real ones. In addition, scale may differ from one drawing to another, and even in one drawing, parts proportions may not always be coordinated with one another. For example, FIG. 8 illustrating an aerial wiring part cross-sectioned along a line A-A of FIG. 2 is compacted in a left-right direction of FIG. 8, and therefore, the left-right length of the aerial wiring part illustrated in FIG. 8 is not proportional to and is quite shorter than the length A-A of FIG. 2, although it corresponds to the length A-A of FIG. 2.

Figure 1:
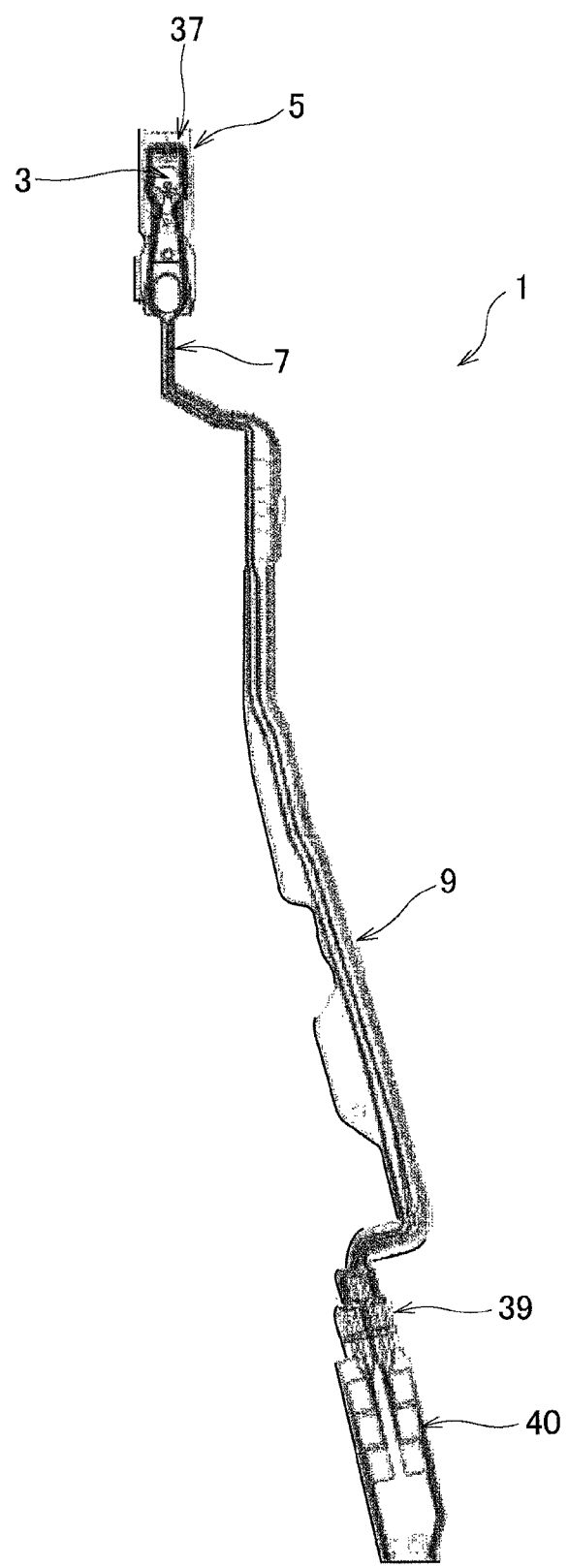
FIG. 1 is a plan view generally illustrating a flexure according to a first embodiment of the present invention.
Figure 3:
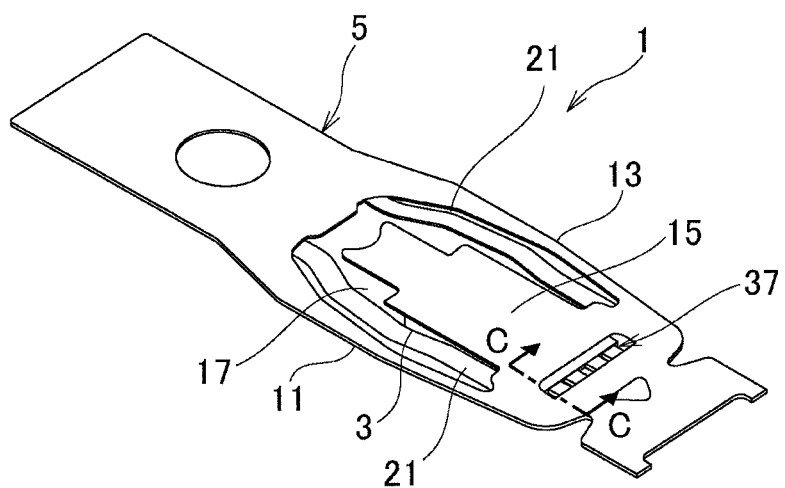
FIG. 3 is an enlarged perspective view illustrating a bottom surface of the part illustrated in FIG. 1.
Figure 4:
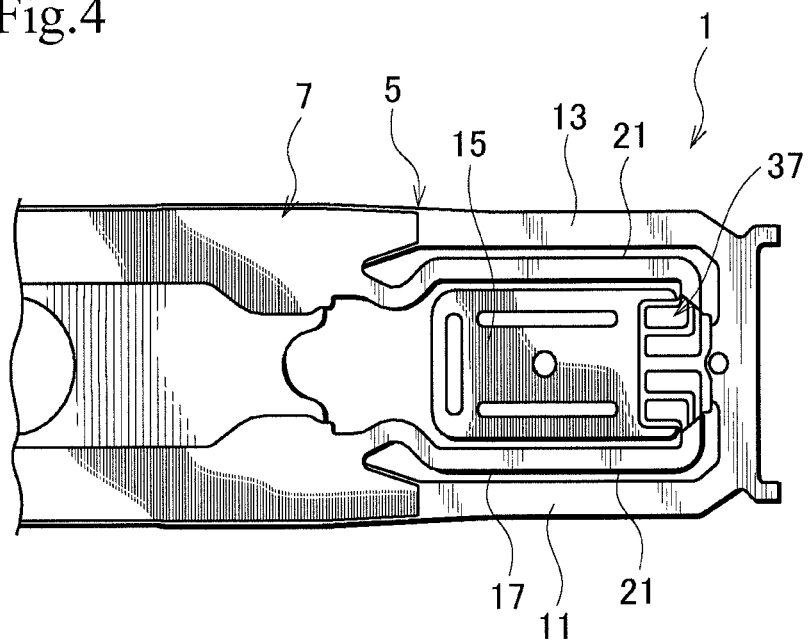
FIG. 4 is a plan view illustrating the part illustrated in FIG. 2.
Figure 5:
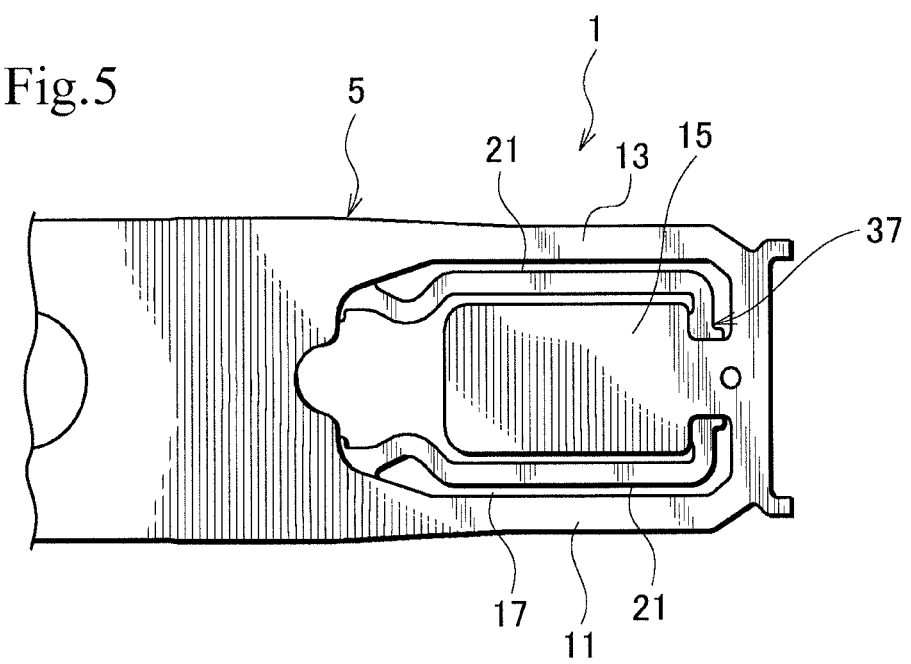
FIG. 5 is a bottom view of the part illustrated in FIG. 4.
Figure 6:
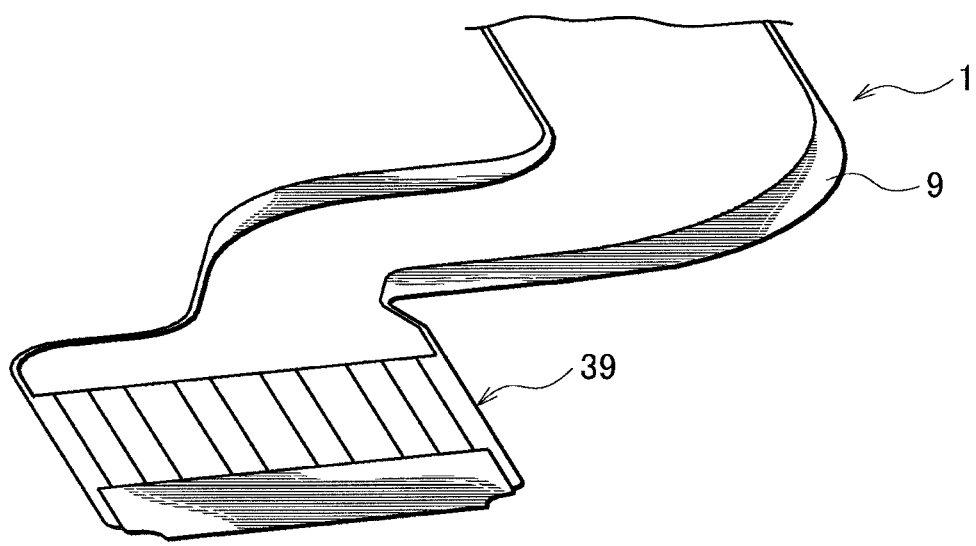
FIG. 6 is an enlarged perspective view illustrating an end of a tail part of the flexure illustrated in FIG. 1.

A general configuration of a flexure according to a first embodiment of the present invention will be explained with reference to FIGS. 1 to 6. FIG. 1 is a plan view generally illustrating the flexure, FIG. 2 is an enlarged perspective view illustrating a top surface of a part of the flexure of FIG. 1, FIG. 3 is an enlarged perspective view illustrating a bottom surface of the part illustrated in FIG. 4 is a plan view illustrating the part illustrated in FIG. 2, FIG. 5 is a bottom view of the part illustrated in FIG. 4, and FIG. 6 is an enlarged perspective view illustrating an end of a tail part of the flexure illustrated in FIG. 1.

The flexure 1 illustrated in FIG. 1 is attached to a load beam of a head suspension that is installed in, for example, a hard disk drive of a personal computer. A front end of the flexure 1 supports a slider 3 that is used to write and read data to and from a hard disk in the hard disk drive.

As illustrated in FIGS. 1 to 6, the flexure 1 has a metal substrate 5 and a wiring part 7. The substrate 5 is a resilient precision metal thin plate made of, for example, stainless steel having a thickness in the range of for example, about 18 to 30 μm.

The substrate 5 is arranged along the load beam of the head suspension and is fixed thereto by, for example, laser welding. A base end of the substrate 5 is the tail part 9 and a front end of the substrate 5 has outriggers 11 and 13 to support a tongue 15.

The outriggers 11 and 13 extend in a longitudinal direction of the flexure 1. The outriggers 11 and 13 protrude from both lateral sides of the front end of the substrate 5, respectively, to support the tongue 15 in a cantilever manner at the front ends thereof.

The tongue 15 has a free end that is oriented toward the base end of the substrate 5. The tongue 15 is arranged between the outriggers 11 and 13. Between the tongue 15 and the outriggers 11 and 13, there is a gap 17 that is a space separated from the substrate 5 in at least a range of the thickness of the substrate 5. Namely, the tongue 15 is arranged along the outriggers 11 and 13 with the gap 17 interposed between them. The gap 17 is extended into a space between the free end of the tongue 15 and an edge of the substrate 5 opposing to the free end of the tongue 15 in the longitudinal direction of the flexure 1.

A bottom surface of the tongue 15 is pivotably supported with a dimple (not illustrated) formed at a front end of the load beam. A top surface of the tongue 15 is provided with the slider 3. The slider 3 is connected to the wiring part 7 to transmit write and read signals.

The wiring part 7 extends from a fixed end of the tongue 15, passes through or over the gap 17 between the tongue 15 and the outriggers 11 and 13, and reaches the tail part 9. The wiring part 7 includes a normal wiring part 19 that extends on the substrate 5 and an aerial wiring part 21 that is on or passes through the gap 17. The normal wiring part 19 and aerial wiring part 21 are continuous with each other.

Figure 7:
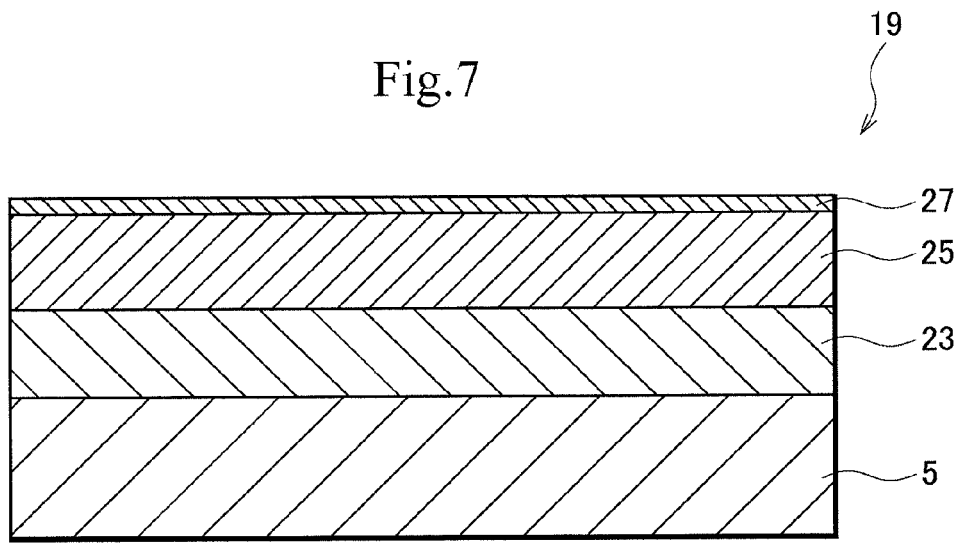
FIG. 7 is a sectional view taken along a line B-B of FIG. 2, illustrating a normal wiring part.

The sectional structure of the wiring part 7 will be explained with reference to FIGS. 7 and 8 in which FIG. 7 is a sectional view taken along a line B-B of FIG. 2, illustrating the normal wiring part 19 and FIG. 8 is a sectional view taken along a line A-A of FIG. 2, illustrating the aerial wiring part 21.

The normal wiring part 19 illustrated in FIG. 7 has a base insulating layer 23 formed on the substrate 5, a conductor layer 25 formed on the base insulating layer 23, and a cover insulating layer 27 formed over the conductor layer 25.

The base insulating layer 23 is made of photosensitive resin such as photosensitive polyimide and is layered over the substrate 5 to secure electrical insulation. The base insulating layer 23 has a thickness in the range of, for example, about 10 to 20 μm. This thickness is adjusted depending on a required dielectric strength voltage.

The conductor layer 25 is made of highly conductive metal such as copper and is layered on the base insulating layer 23 to a thickness in the range of, for example, about 3 to 18 μm.

The cover insulating layer 27 is made of photosensitive resin such as photosensitive polyimide and is layered over the conductor layer 25 to cover the conductor layer 25. The cover insulating layer 27 has a thickness in the range of, for example, about 1 to 5 μm.

The aerial wiring part 21 illustrated in FIG. 8 is continuous with the normal wiring part 19 and includes, similar to the normal wiring part 19, the base insulating layer 23, conductor layer 25, and cover insulating layer 27. The base insulating layer 23 of the aerial wiring part 21 has a thinned section 29.

Namely, the base insulating layer 23 of the aerial wiring part 21 has a first recess 31 that is formed in a face of the base insulating layer 23 opposite to the substrate 5. The first recess 31 is formed substantially along the whole length of the aerial wiring part 2 corresponding to the gap 17. The first recess 31 provides the base insulating layer 23 of the aerial wiring part 21 with the thinned section 29 that is thinner than the base insulating layer 23 of the normal wiring part 19.

The thinned section 29 has a plate-like shape with slopes 33 and 35 that gradually rise toward the normal thickness of the base insulating layer 23 of the normal wiring part 19.

On the base insulating layer 23 of the aerial wiring part 21, the conductor layer 25 and cover insulating layer 27 are successively layered along the first recess 31. The conductor layer 25 and cover insulating layer 27 of the aerial wiring part 21 have substantially the same thicknesses as the conductor layer 25 and cover insulating layer 27 of the normal wiring part 19 and are collectively biased toward the substrate 5.

Returning to FIGS. 1 to 6, the wiring part 7 has a front terminal 37 connected to a terminal (not illustrated) of the slider 3 and a rear terminal 39 connected to a terminal (not illustrated) of external wiring, as illustrated in FIG. 1.

The front terminal 37 is arranged at the fixed end of the tongue 15 and the rear terminal 39 is arranged at an end of the tail part 9. According to the first embodiment, the front and rear terminals 37 and 39 have an identical sectional structure, and therefore, only the front terminal 37 will be explained in detail and the rear terminal 39 will not be explained. The tail part 9 also has a test terminal 40 that is used for an electrical characteristic test of the flexure 1 after the slider 3 is installed on the flexure 1. The test terminal 40 has the same sectional structure as the front and rear terminals 37 and 39.

Figure 9:
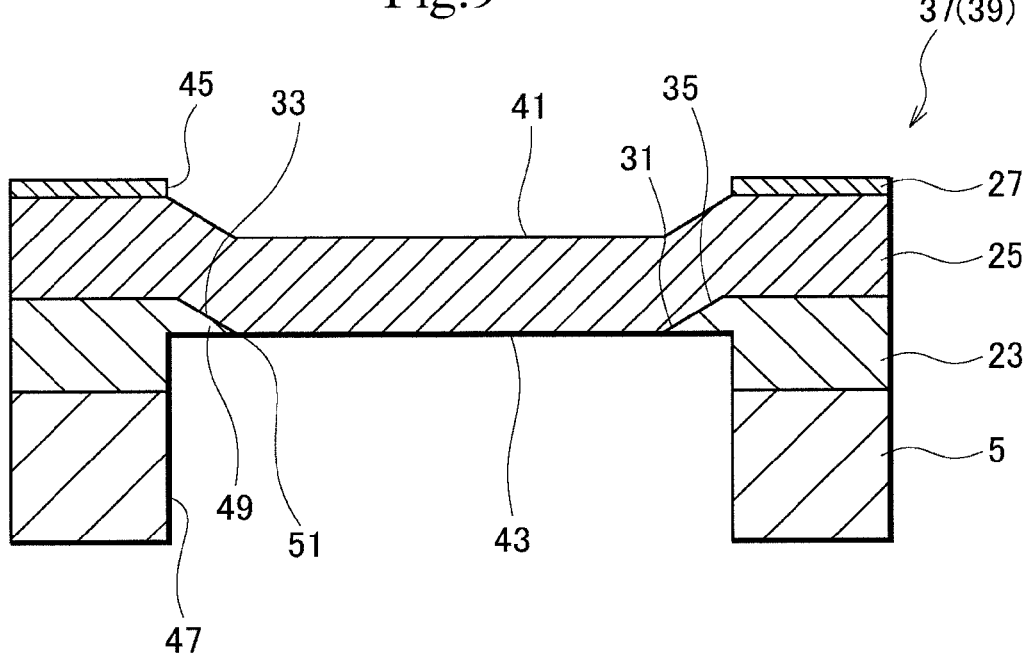
FIG. 9 is a sectional view taken along a line C-C of FIG. 3, illustrating a terminal part.

FIG. 9 is a sectional view taken along a line C-C of FIG. 3, illustrating the front terminal 37.

The front terminal 37 has terminal faces 41 and 43 to expose the conductor layer 25 on both sides in a thickness or layer direction of the wiring part 7.

At the terminal 37, the base insulating layer 23 has the first recess 31 like the aerial wiring part 21. On the base insulating layer 23, the conductor layer 25 is layered such that the conductor layer 25 follows the first recess 31. The conductor layer 25, therefore, is biased toward the substrate 5.

On the conductor layer 25, the cover insulating layer 27 is provided with a cover opening 45 to expose the conductor layer 25 as the terminal face 41 on one side in the layer direction. On the terminal face 41, a terminal layer (not illustrated) is formed by, for example, metal plating.

On an opposite face of the terminal 37, the substrate 5 is provided with a substrate opening 47 corresponding to the first recess 31 of the base insulating layer 23. In the substrate opening 47, the base insulating layer 23 is provided with a second recess 49.

The second recess 49 reaches the first recess 31, to form an opening 51 in the base insulating layer 23. The opening 51 exposes the conductor layer 25 as the terminal face 43 on the other side in the layer direction. On the terminal face 43, a terminal layer (not illustrated) is formed by, for example, metal plating.

A method of forming the wiring part 7 of the flexure 1 according to the first embodiment will be explained with reference to FIGS. 10 to 12.

The method includes terminal forming steps to form the terminals 37 and 39 and aerial wiring forming steps to form the aerial wiring part 21. The aerial wiring forming steps are realized by partly omitting the terminal forming steps, so that the terminals 37 and 39 and aerial wiring part 21 are simultaneously formed.

Figure 10:
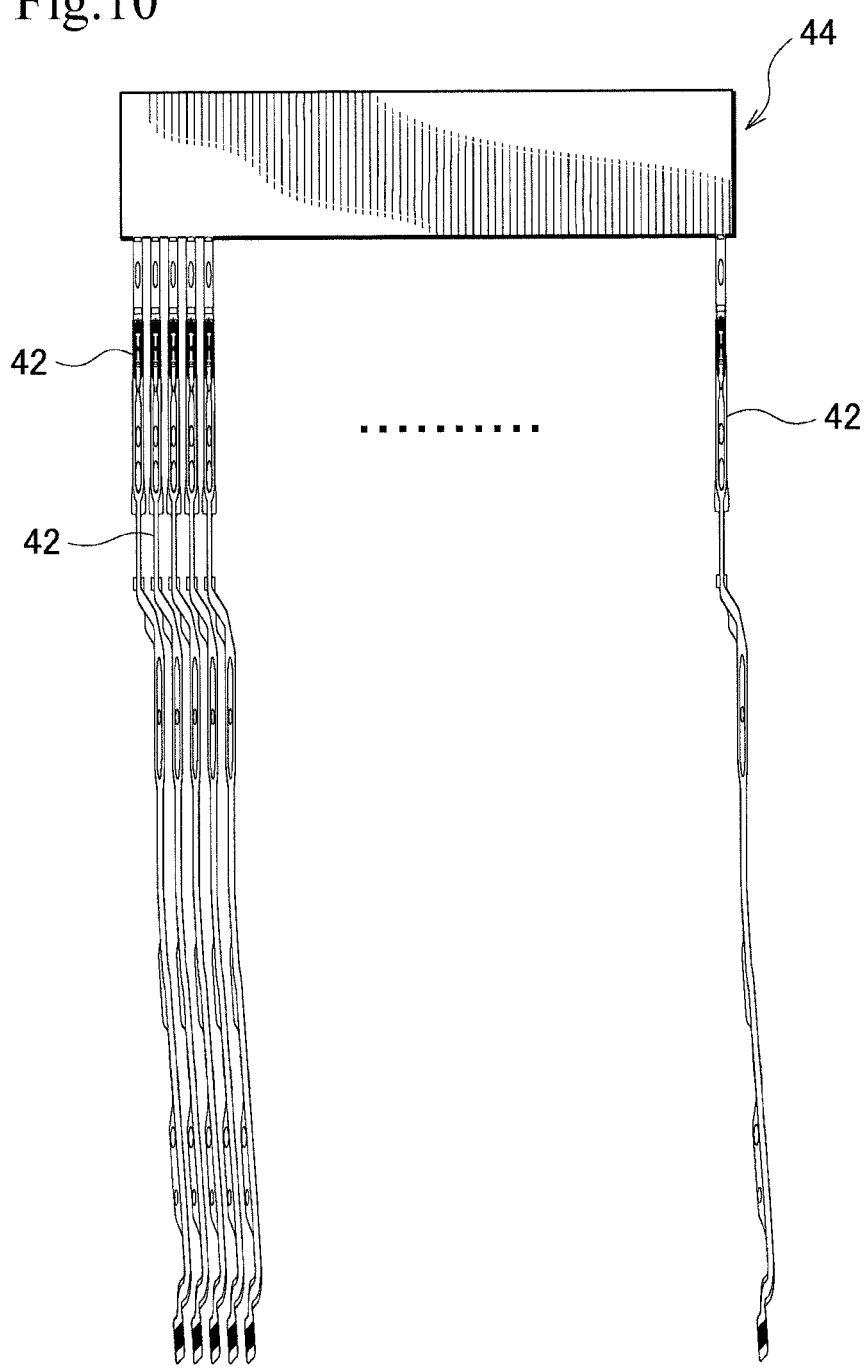
FIG. 10 is a plan view illustrating a frame in which many half-finished flexures are chained used for a method of forming the wiring part of the flexure according to the first embodiment.

FIG. 10 is a plan view illustrating a frame 44 in which many half-finished flexures 42 are chained used for a method of forming the wiring part of the flexure according to the first embodiment.

In FIG. 10, the wiring part forming method prepares a frame or panel 44 in which many half-finished flexures 42 are chained together. The panel 44 serves as the metal substrates 5 of the half finished flexures 42 and is etched into individual shapes of the half-finished flexures 42.

From the panel 44 of the half-finished flexures 42, the wiring part forming method according to the first embodiment simultaneously produces a plurality of flexures 1.

Figure 11A:
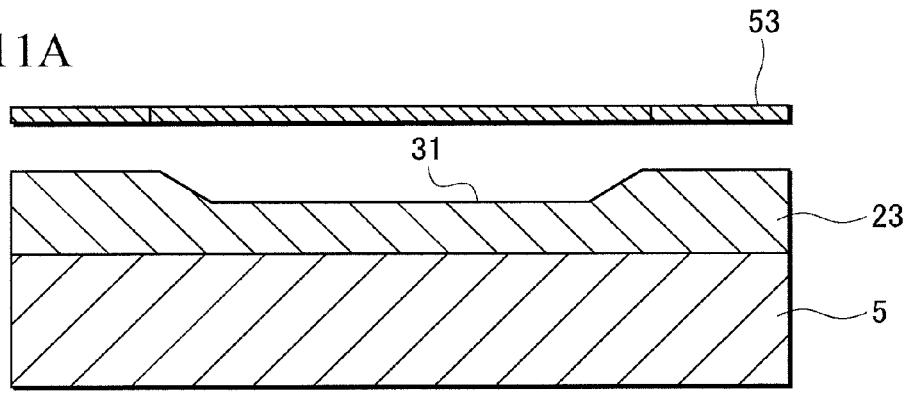
FIGS. 11A to 11C are sectional views illustrating steps of forming the terminal part of the flexure according to the first embodiment.
Figure 11B:
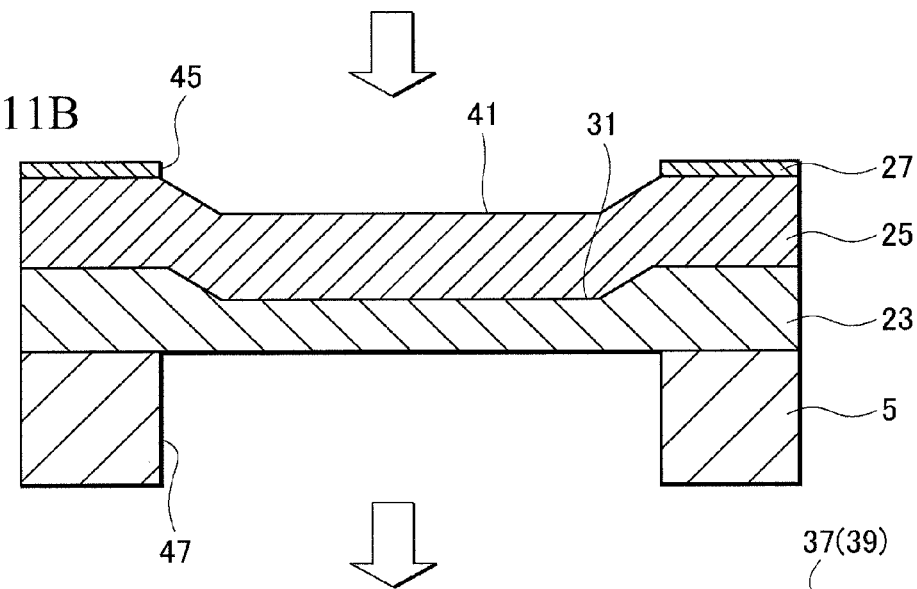
Figure 11C:
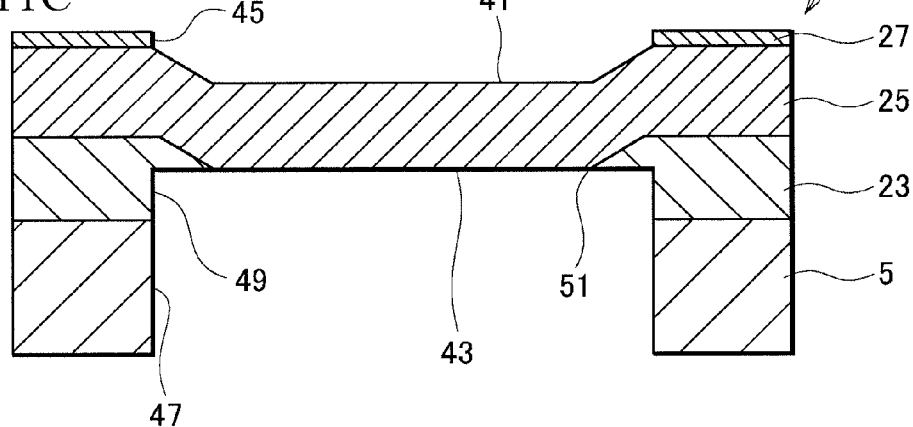

FIGS. 11A, 11B and 11C are sectional views illustrating terminal forming steps to form the terminal part 37 (39) of the wiring part 7 of the flexure 1.

The terminal forming steps include a base forming step, a first recess forming step, a conductor layer forming, step, a cover forming step, a space forming step, and a second recess forming step.

In FIG. 11A, the base forming step forms the base insulating layer 23 on the metal substrate 5. More precisely, a precursor solution of photosensitive polyimide, resin is applied onto the substrate 5 and a heat treatment at about 60 to 150° C. is carried out to form a film of the precursor of photosensitive polyimide resin serving as the base insulating layer 23. After forming the base insulating layer 23, the first recess forming step is conducted.

The first recess forming step forms the first recess 31 in the base insulating layer 23 on the opposite side opposing the substrate 5 by exposure and development of the base insulating layer 23.

Exposure of the base insulating layer 23 is carried out by applying a gradation mask 53 to the base insulating layer 23 on the opposite side opposing the substrate 5. The gradation mask 53 is employed to achieve different exposure amounts to form the front and rear terminals 37 and 39 and the remaining part. The exposure amount for the terminals 37 and 39 is selected to be lower than that for the remaining part if the exposed part must be insoluble during development and higher if the exposed part must be soluble during development.

The gradation mask 53 is patterned to adjust exposure amounts depending on whether the terminals 37 and 39 must be insoluble or soluble. The gradation mask 53 is patterned by, for example, increasing the surface roughness of the gradation mask 53, or by attaching a light absorbing film to the gradation mask 53, or by forming a light blocking pattern on the gradation mask 53.

After the exposure, a heat treatment is carried out at about 130° C. to 150° C. for solubilization, or at about 150° C. to 80° C. for insolubilization.

After the heat treatment, development is carried out with the use of, for example, an alkaline developer, to form the first recess 31 in the base insulating layer 23. When forming the first recess 31, patterning the base insulating layer 23 is also carried out.

After the development, a heat treatment is carried out at about 250° C. or over to harden the base insulating layer 23 provided with the first recess 31. After forming the first recess 31, the conductor layer forming step is conducted.

The conductor layer forming step forms the conductor layer 25 on the base insulating layer 23 of the terminals 37 and 39 and of the remaining part by patterning.

For example, the conductor layer forming step forms a resist pattern on the base insulating layer 23, carries out electroless plating to form a predetermined circuit pattern on the base insulating layer 23, and etches off the resist pattern, thereby completing the patterned conductor layer 25 on the base insulating layer 23. After forming the conductor layer 25, the cover forming step is conducted.

The cover forming step forms the cover insulating layer 27 on the conductor layer 25 of the terminals 37 and 39 and of the remaining part by applying a precursor photosensitive polyimide and forming the film thereof on the conductor layer 25.

A gradation mask is used to pattern the cover insulating layer 27 by exposure and development. While patterning, the cover opening 45 is formed through the cover insulating layer 27. The cover opening 45 provides the terminal face 41 to expose the conductor layer 25 on the terminal 37 (39) on the one side in the layer direction of the wiring part 7.

A heat treatment is carried out at about 250° C. or higher to harden the cover insulating layer 27.

The space forming step partly removes the substrate 5 by, for example, etching and forms the substrate opening 47 defining a gap as the space under the terminal 37 (39) that corresponds to the first recess 31 of the base insulating layer 23. After forming the substrate opening 47, the second recess forming step is conducted.

The second recess forming step forms the second recess 49 in the base insulating layer 23 within the substrate opening 47, so that the second recess 49 reaches the first recess 31. The second recess 49 is formed by etching the base insulating layer 23 with the substrate 5 serving as a mask.

The second recess 49 thus formed reaches the first recess 31 of the base insulating layer 23. The first and second recesses 31 and 49 form the opening 51 in the base insulating layer 23, to provide the terminal 37 (39) with the terminal face 43 to expose a bottom face of the conductor layer 25 on the other side in the layer direction of the wiring part 7.

In this way, each of the terminals 37 and 39 is provided with the terminal faces 41 and 43, which are plated with metal to form the terminal layers thereon.

Together with the terminals 37 and 39, the terminal forming steps mentioned above also form the test terminal 40.

The above-mentioned sequence of the terminal forming steps may be changed into any other sequence if the terminals 37 and 39 are properly formed. For example, the base forming step and first recess forming step are carried out, and thereafter, the space forming step may be carried out.

Figure 12A:
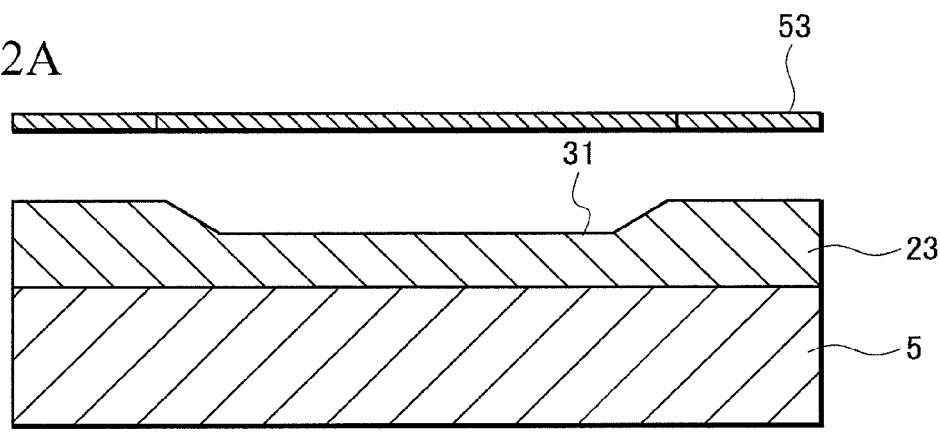
FIGS. 12A and 12B are sectional views illustrating steps of forming the aerial wiring part of the flexure, according to the first embodiment.
Figure 12B:
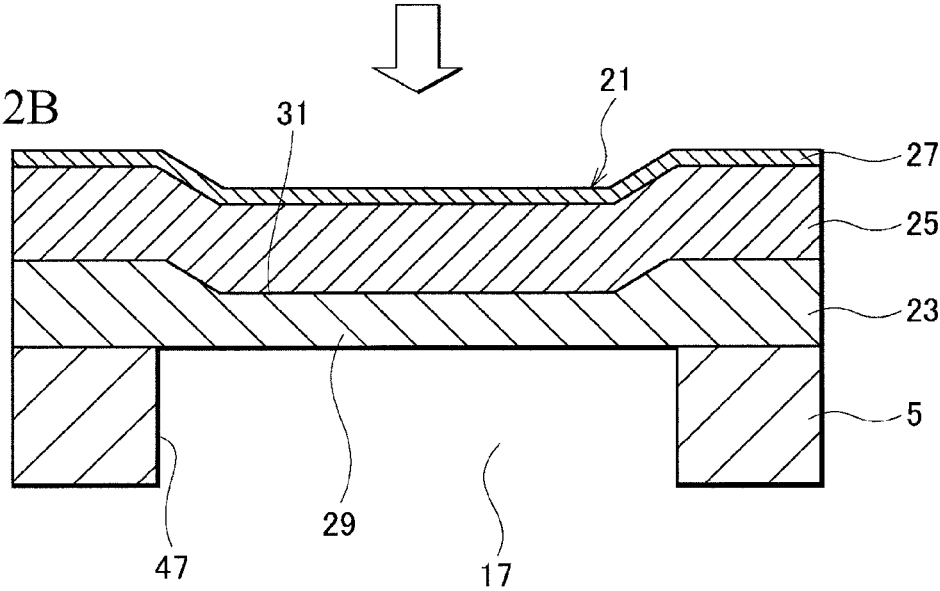

FIGS. 12A and 12B are sectional views illustrating aerial wiring forming steps to form the aerial wiring part 21 of the wiring part 7 of the flexure 1.

The aerial wiring part 21 is formed by applying the above-mentioned terminal forming steps except the second recess forming step as the aerial wiring forming steps to a section of the wiring part 7 between the tongue 15 and the outriggers 11 and 13 where the aerial wiring part 21 is needed.

Namely, among the terminal forming steps, the base forming step, first recess forming step, conductor layer turning step, cover forming step, and space forming step are used to form the aerial wiring part 21.

In FIG. 12A, the base forming step forms the base insulating layer 23 on the substrate 5, like the case of forming the terminals 37 and 39. The first recess forming step employs the gradation mask 53 to carry out exposure and development.

The gradation mask 53 has an exposure amount reducing pattern at locations where the terminals 37 and 39 and aerial wiring part 21 are formed or locations other than them. With the gradation mask 53, the first recess 31 is formed in the base insulating layer 23 of the aerial wiring part 21.

In FIG. 12B, the conductor layer forming step forms the conductor layer 25 on the base insulating layer 23 and the cover forming step forms the cover insulating layer 27 over the conductor layer 25.

The space forming step partly etches off the substrate 5 between the tongue 15 and the outriggers 11 and 13, to form the substrate opening 47 defining the gap 17 that is the space under the aerial wiring part 21. Over the gap 17, the base insulating layer 23 and conductor layer 25 are left to form the aerial wiring part 21.

In this way, the wiring part forming method according to the first embodiment forms, together with the terminals 37 and 39, the aerial wiring part 21 having the base insulating layer 23 thinned by the first recess 31.

When forming the aerial wiring part 21, the second recess forming step among the terminal forming steps is not carried out on a section of the flexure 1 where the aerial wiring part 21 is formed such that the second recess forming step carries out etching to the parts other than the section.

Rigidity contribution ratios will be explained with reference to FIG. 13 that is a table listing rigidity contribution ratios of the first embodiment and comparative example. Data in FIG. 13 are obtained by analyzing, with a finite element method, rigidity contribution ratios of the aerial wiring part 21 in a roll direction around a center axis of the flexure 1 and in a pitch direction around an axis orthogonal to the center axis.

The rigidity contribution ratio is a ratio of rigidity of the aerial wiring part 21 to a total rigidity of the substrate 5 and aerial wiring part 21 around the tongue 15. The list of FIG. 13 includes a roll contribution ratio concerning roll rigidity and a pitch contribution ratio concerning pitch rigidity.

Figures 13, 14:
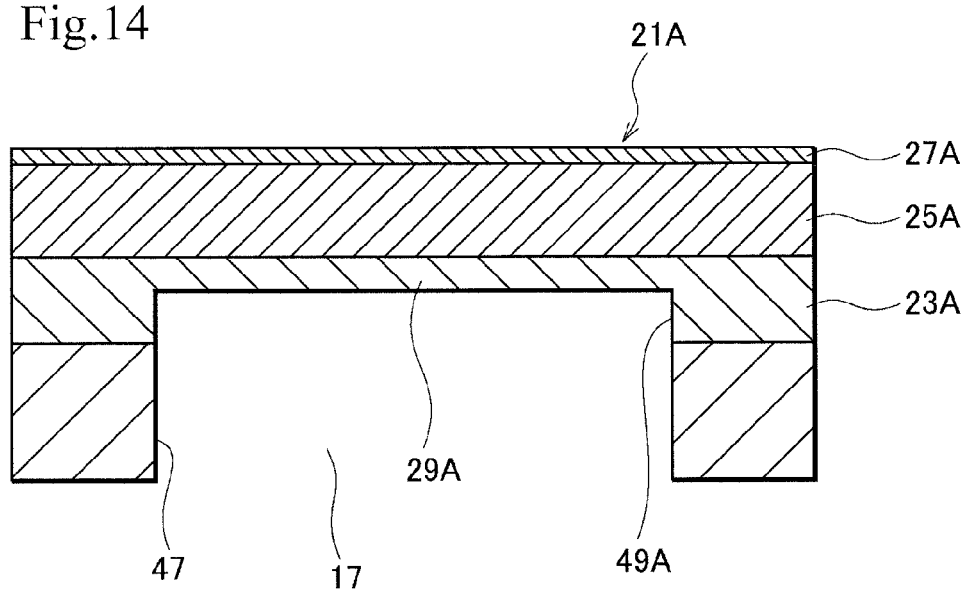
FIG. 13 is a table listing rigidity contribution ratios of the first embodiment and comparative example.
FIG. 14 is a sectional view illustrating an aerial wiring part of a flexure according to a second embodiment of the present invention.

In FIG. 13, the comparative example represents an aerial wiring part having a base insulating layer of constant thickness. Namely, the comparative example has a metal substrate having a thickness of about 18 μm, the base insulating layer having a thickness of about 10 μm, a conductor layer having a thickness of about 12 μm, and a cover insulating layer having a thickness of about 3 μm. The aerial wiring part 21 according to the first embodiment of the present invention has the same thicknesses as the comparative example except the base insulating layer that is thinner than that of the comparative example.

As is apparent in FIG. 3, the aerial wiring part 21 according to the first embodiment is lower than the comparative example in the roll rigidity and pitch rigidity and the roll contribution ratio and pitch contribution ratio of the first embodiment are greatly reduced to about a half of those of the comparative example.

Effect of the first embodiment will be explained.

According to the first embodiment, the flexure 1 includes the metal substrate 5 whose front end supports the slider 3 and the wiring part 7 having the base insulating layer 23 and conductor layer 25. The wiring part 7 includes the normal wiring part 19 that is on the substrate 5 and the aerial wiring part 21 that passes through or is on the gap 17 separated from the substrate 5. The base insulating layer 23 of the aerial wiring part 21 is formed to be thinner than that of the normal wiring part 19.

The flexure 1 according to the first embodiment reduces the rigidity and rigidity contribution ratio of the wiring part 7 at the aerial wiring part 21, to make it easy to surely control the rigidity of the flexure 1.

The first embodiment partly thins the base insulating layer 23 of the flexure 1 only at the aerial wiring part 21, and therefore, secures a required dielectric strength voltage for the normal wiring part 19.

According to the first embodiment, the substrate 5 has the outriggers 11 and 13 protruding from a front end of the substrate 5 and the tongue 15 supported at front ends of the outriggers 11 and 13 and extended in parallel with the outriggers 11 and 13. The aerial wiring part 21 passes through or is in on the gap 17 between the tongue 15 and the outriggers 11 and 13.

With this configuration, the first embodiment surely controls rigidity around the tongue 15 and realizes a low flying height of the slider 3.

According to the first embodiment, the wiring part forming method includes the terminal forming steps that include the base forming step to form the base insulating layer 23 on the substrate 5, the first recess forming step to form the first recess 31 in the base insulating layer 23 on the opposite side opposing the substrate 5, the conductor layer forming step to form the conductor layer 25 on the base insulating layer 23 such that the conductor layer 25 follows the opposite side of the base insulating layer 23, the space forming step to partly remove the substrate 5 and form the substrate opening 47 corresponding to the first recess 31, and the second recess forming step to form the second recess 49 in the base insulating layer 23 on a metal substrate side facing the substrate 5 within the substrate opening 47 up to the first recess 31. At a location where the aerial wiring part 21 is formed, the first embodiment applies aerial wiring forming steps that omits the second recess forming step among the terminal forming steps, thereby forming the aerial wiring part 21 together with the terminals 37 and 39.

With this method, the first embodiment easily and surely forms the aerial wiring part 21 having the base insulating layer 23 thinned by the first recess 31.

The first embodiment forms the aerial wiring part 21 simultaneously with the terminals 37 and 39 by partly omitting the terminal forming steps. Namely, the first embodiment easily and surely forms the aerial wiring part 21 without additional processes.

According to the first embodiment, the base insulating layer 23 is made of photosensitive resin whose thickness is adjustable by adjusting an exposure amount applied thereto. To adjust the exposure amount and form the first recess 31, the first recess forming step uses the gradation mask 53.

Namely, to adjust the exposure amount, the first embodiment adjusts the pattern of the gradation mask 53 so that the first recess forming step may easily and surely form the aerial wiring part 21.

The first embodiment carries out etching to achieve the second recess forming step of forming the second recess 49 because the etching is appropriate for not conducting the second recess forming step at the location where the aerial wiring part 21 is formed and for avoiding the aerial wiring part 21 from having the second recess 49.

A flexure according to a second embodiment of the present invention will be explained with reference to FIG. 14. The flexure of the second embodiment is generally the same as that of the first embodiment, and therefore, parts corresponding to those of the first embodiment are represented with the same reference marks as those of the first embodiment, or the same reference marks plus "A" to omit repetition of explanation.

FIG. 14 is a sectional view illustrating an aerial wiring part 21A of a flexure 1A.

In FIG. 14, the second embodiment employs the aerial wiring part 21A. Instead of the first recess 31 of the first embodiment, the aerial wiring part 21A of the second embodiment has a second recess 49A formed in a base insulating layer 23A on the metal substrate side, to thin the base insulating layer 23A.

The second recess 49A is formed in the base insulating layer 23A within a substrate opening 47 formed in the substrate 5. The second recess 49A provides the base insulating layer 23A with a thinned section 29A that is thinner than the base insulating layer 23A of a normal wiring part 19. A face of the base insulating layer 23A opposite to the substrate 5 is flat like that of the normal wiring part 19.

The aerial wiring part 21A is formed by applying, to a wiring part 7A, the terminal forming steps of the wiring part forming method according to the first embodiment excluding the first recess forming step.

Figure 15A:
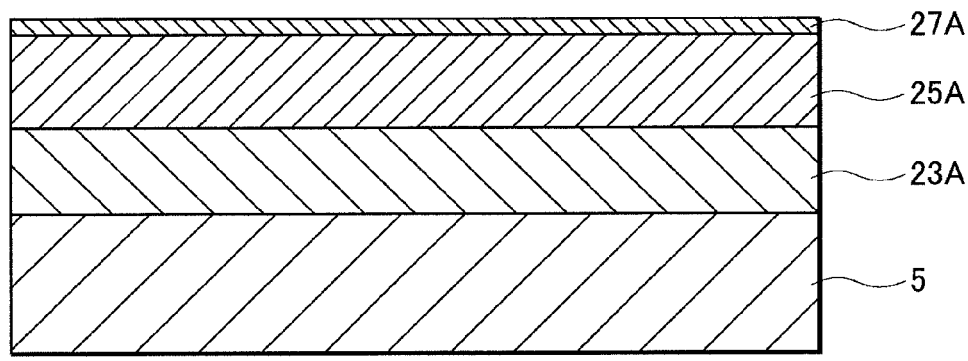
FIGS. 15A and 15B are sectional views illustrating steps of forming the aerial wiring part according to the second embodiment.
Figure 15A:
Figure 15B:
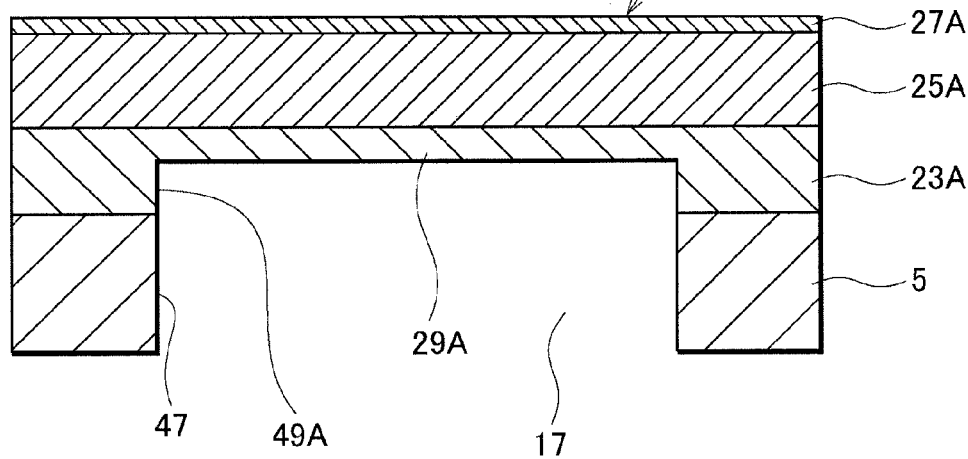

A method of forming the wiring part 7A of the flexure 1A according to the second embodiment will be explained with reference to FIGS. 15A and 15B in which FIGS. 15A and 15B are sectional views illustrating forming the aerial wiring part 21A.

The aerial wiring part 21A is formed through the base forming step, conductor layer forming step, cover forming step, space forming step, and second recess forming step selected from among the terminal forming steps of the first embodiment.

In FIG. 15A, the base forming step forms the base insulating layer 23A on the metal substrate 5.

The first recess forming step is carried out only on the terminals 37 and 39 and is not carried out on the aerial wiring part 21A. Omitting the first recess forming step from the aerial wiring part 21A is realized by adjusting the pattern of a gradation mask. Namely, the gradation mask is provided with an exposure amount adjustable pattern reducing the exposure amount at locations where the terminals 37 and 39 are formed, or at locations except the locations of the terminals 37 and 39.

The conductor layer forming step forms the conductor layer 25A on the base insulating layer 23A. The cover forming step forms a cover insulating layer 27A over the conductor layer 25A.

In FIG. 5B, the space forming step removes the substrate 5 between the tongue 15 and the outriggers 11 and 13, to form a substrate opening 47 defining a gap 17 and the aerial wiring part 21A passing through or being on the gap 17.

The second recess forming step forms the second recess 49A in the base insulating layer 23A within the gap 17 defined by the substrate opening 47. The second recess 49A is formed by etching the base insulating layer 23A with the substrate 5 serving as a mask.

In this way, the wiring part forming method according to the second embodiment forms the aerial wiring part 21A having the thinned section 29A thinned by the second recess 49A, as well as the terminals 37 and 39.

The second recess forming step is executable after the base forming step and space forming step. Namely, if the second recess forming step is carried out after the base forming step and space forming step, it is allowed to alter the sequence of the steps of forming the aerial wiring part 21A.

Rigidity contribution ratios will be explained with reference to FIG. 16 in which FIG. 16 is a table listing rigidity contribution ratios of the second embodiment and comparative example. Data in this table are obtained by analyses conducted under the same conditions as those for the first embodiment of FIG. 13.

As is apparent in the table of FIG. 16, the aerial wiring part 21A of the second embodiment is lower in both roll rigidity and pitch rigidity than the comparative example. The roll contribution ratio and pitch contribution ratio of the second embodiment are greatly reduced to about a half of those of the comparative example.

As explained above, the wiring part forming method according to the second embodiment applies the terminal forming steps excluding the first recess forming step to forming the aerial wiring part 21A having the base insulating layer 23A thinned by the second recess 49A. Like the first embodiment, the second embodiment forms the aerial wiring part 21A simultaneously with the terminals 37 and 39.

The second embodiment provides operation and effect that are similar to those of the first embodiment.

The second embodiment easily and surely omits the first recess forming step from the wiring part 7A by adjusting the pattern of a gradation mask.

The second embodiment adopts etching when performing the second recess forming step of forming the second recess 49A because the etching easily and surely forms the second recess 49A in the base insulating layer 23A of the aerial wiring part 21A.

A flexure according to a third embodiment of the present invention will be explained with reference to FIGS. 17, 18, and 19. The flexure of the third embodiment is generally the same as those of the first and second embodiments, and therefore, parts corresponding to those of the first and second embodiments are represented with the same reference marks as those of the first and second embodiments, or the same reference marks plus "B" to omit repetition of explanation.

Figure 17:
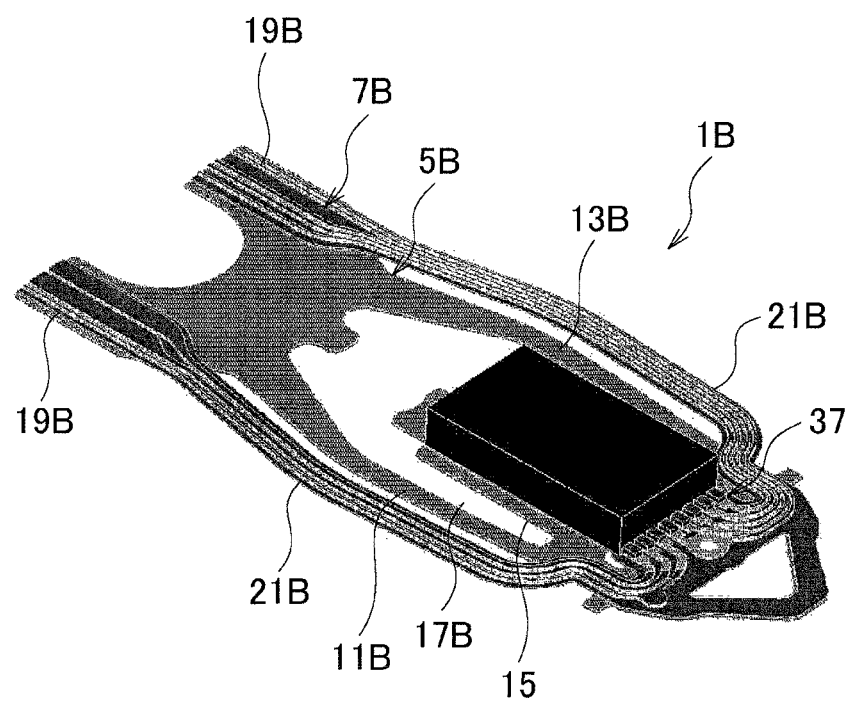
FIG. 17 is an enlarged perspective view illustrating a top surface of a part of a flexure according to a third embodiment of the present invention.
Figure 18:
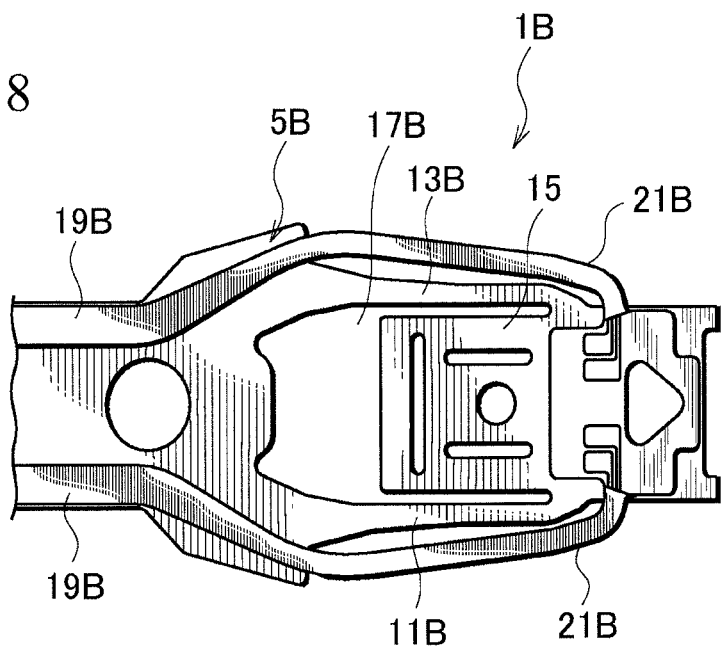
FIG. 18 is a plan view illustrating the part illustrated in FIG. 17.
Figure 19:
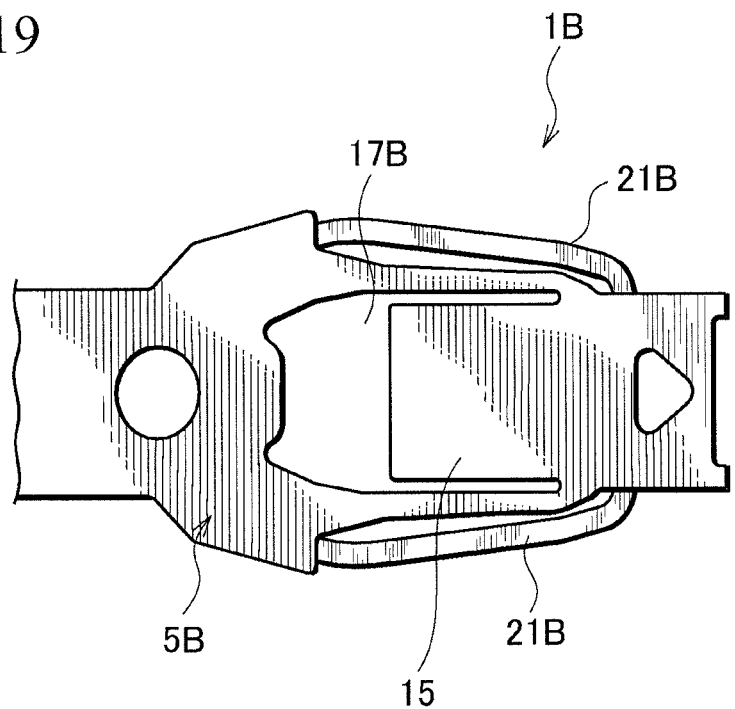
FIG. 19 is a bottom view of the part illustrated in FIG. 18.

FIG. 17 is an enlarged perspective view illustrating a top surface of a part of the flexure according to the third embodiment, FIG. 18 is a plan view illustrating the part illustrated in FIG. 17, and FIG. 19 is a bottom view of the part illustrated in FIG. 18.

Unlike the first and second embodiments that employ the aerial wiring part 21 (21A) passing through or being on the gap 17 between the tongue 15 and the outriggers 11 and 13, the third embodiment employs an aerial wiring part 21B that passes through or is on a space outside outriggers 11B and 13B as illustrated in FIGS. 17 to 19.

A wiring part 7B of the third embodiment extends from a fixed end of a tongue 15B and runs outside the outriggers 11B and 13B across them.

Outside the outriggers 11B and 13B, the wiring part 7B forms the aerial wiring part 21B that passes through or is on the outside space. The aerial wiring part 21B extends in parallel with the outriggers 11B and 13B. The aerial wiring part 21B is formed according to the wiring part forming method of any one of the first and second embodiments and has a sectional configuration determined by the method.

At a base end of each of the outriggers 11B and 13B, the wiring part 7B transitions from the aerial wiring part 21B to a normal wiring part 19B that runs on a metal substrate 5B. The normal wiring part 19B reaches a tail part 9 of the flexure 1B.

The third embodiment provides operation and effect that are similar to those of the first and second embodiments.

Although the present invention has been explained in connection with the first, second, and third embodiments, it must be understood that these embodiments are not intended to limit the present invention and allow various modifications and variations.

For example, in addition to forming the aerial wiring part 21 through the gap 17 between the tongue 15 and the outriggers 11 and 13, it may be formed through an opening opened in a hinge of a load beam of a head suspension. Instead of exposing each face of the conductor layer 25 at the terminals 37 and 39 on both sides in the layer direction of the wiring part 7, it may be exposed at one of the terminals 37 and 39.

What is claimed is:

1. A method of forming a wiring part of a flexure having a metal substrate, the metal substrate having a front end supporting a slider, the wiring part having a base insulating layer and a conductor layer formed on the base insulating layer, the wiring part including a normal wiring part that is on the metal substrate, and an aerial wiring part that is on a space separated from the metal substrate, the base insulating layer of the aerial wiring part being formed to be thinner than that of the normal wiring part, the wiring part further including a terminal where each face of the conductor layer is exposed in a layer direction of the wiring part, the method comprising steps of:

forming the terminal by:
    forming the base insulating layer on the metal substrate;
    forming a first recess in the base insulating layer on a first side opposite to the metal substrate in the layer direction;
    forming the conductor layer on the base insulating layer such that the conductor layer follows the first side of the base insulating layer and has a first face exposed through the first recess and a second face opposite to the first face in the layer direction;
    partly removing the metal substrate and forming a substrate opening corresponding to the first recess; and
    forming a second recess in the base insulating layer adjacent to the substrate opening from a metal substrate side up to the first recess so that the second face of the conductor layer of the terminal is exposed through the second recess and the substrate opening; and forming the aerial wiring part simultaneously with the terminal by:
    executing the steps, on a portion of the wiring part proximate to the terminal, of forming the base insulating layer on the metal substrate, and a) forming a first wiring recess, the conductor layer, and a wiring substrate opening or b) forming the conductor layer, the wiring substrate opening, and a second wiring recess, thereby to leave, along the first face or the second face of the conductor layer of the aerial wiring part, the base insulating layer of the aerial wiring part being thinner than the base insulating layer of the normal wiring part and the base insulating layer extending across the entire wiring substrate opening.

2. The method of claim 1, wherein the base insulating layer is made from photosensitive resin whose thickness is determined according to an exposure amount applied thereto, and
    the first recess forming step forms the first recess by adjusting an exposure amount applied to the photosensitive resin with the use of a gradation mask.

3. The method of claim 1, wherein the second recess forming step forms the second recess by etching the base insulating layer.

* * * * *